United States Patent [19]
Kim et al.

[11] Patent Number: 6,023,177
[45] Date of Patent: Feb. 8, 2000

[54] SEMICONDUCTOR MEMORY DEVICE FOR PROVIDING BURST MODE CONTROL SIGNAL, DEVICE COMPRISING PLURAL SERIAL TRANSITION REGISTERS

[75] Inventors: Eun-Cheol Kim, Ohsan; Chul-Min Jung, Seoul, both of Rep. of Korea

[73] Assignee: Samsung Electronics, Co., Ltd., Suwon, Rep. of Korea

[21] Appl. No.: 08/988,312

[22] Filed: Dec. 11, 1997

[30] Foreign Application Priority Data

Dec. 11, 1996 [KR] Rep. of Korea ........................ 96-64390

[51] Int. Cl.[7] .................................................... H03L 7/00
[52] U.S. Cl. ............................ 327/142; 327/161; 327/291
[58] Field of Search ..................................... 327/141, 142, 327/161, 172, 173, 225, 291; 365/233, 233.5; 711/167

[56] References Cited

U.S. PATENT DOCUMENTS

| | | | |
|---|---|---|---|
| 4,758,737 | 7/1988 | Hirano | 327/291 |
| 5,461,649 | 10/1995 | Bailey et al. | 327/225 |
| 5,552,732 | 9/1996 | Huang | 327/225 |
| 5,640,583 | 6/1997 | Assouad et al. | 395/800 |
| 5,719,517 | 2/1998 | Nakao | 327/291 |

*Primary Examiner*—Jung Ho Kim
*Attorney, Agent, or Firm*—Marger Johnson & McCollom, P.C.

[57] ABSTRACT

A semiconductor memory device for providing a burst mode control signal. The semiconductor memory device includes a first logic circuit for generating a driving signal in response to a first logic level of an externally input write and read control signal and an externally input chip enable signal, a plurality of transition registers for respectively changing the driving signal in synchronization with a first edge of a clock signal to generate changed driving signals, and a second logic circuit for generating the burst mode control signal generated by the logic combination of the changed driving signals in response to a read latency control signal.

15 Claims, 2 Drawing Sheets

SEMICONDUCTOR MEMORY DEVICE FOR PROVIDING BURST MODE CONTROL SIGNAL, DEVICE COMPRISING PLURAL SERIAL TRANSITION REGISTERS

BACKGROUND OF THE INVENTION

1. Field of the Invention

The present invention relates to semiconductor memory devices and, more particularly, to a semiconductor memory device which internally generates a burst mode control signal.

2. Description of the Related Art

Generally, memory devices are characterized by their addressing mode. One addressing mode is burst mode. In a burst mode memory device, a read/write operation is performed on an initial externally supplied address along with a number of successive addresses where the successive addresses are internally generated. To internally generate the successive addresses, a counter is used where the number of successive addresses can be adjusted by an external control signal.

Typically, a burst address advance ADV signal is used to request burst mode operation. The ADV signal is generated by a central processing unit (CPU) and is used to advance an internal burst counter in order to control burst access after an initial address is loaded. When the ADV signal is not active, the internal burst counter will not increment and the address will not advance.

In burst mode, a burst mode memory device 202 typically receives the ADV signal from a CPU 201 as shown in FIG. 1. CPU 201 also generates other memory control signals, such as a Synchronous Address Status from Cache Controller signal ADSC or a Synchronous Address Status from Processor signal ADSP, which control read and write and read operations. The ADSC signal is used to load internal address registers with new addresses. (Note that where the ADSC signal is referred to throughout the specification, the reference equally applies to an ADSP signal.) A chip enable signal CE is used to enable the memory device. A read latency signal RL is used along with the burst mode control signal ADV to start the read/write operation. When the ADV signal for memory device 202 is generated by CPU 201, then an ADV pulse can only be generated at fixed intervals in the CPU execution cycle. As a result, the intervals at which the ADV signal can be generated is limited by the CPU.

SUMMARY OF THE INVENTION

An object of the present invention is to provide a semiconductor memory device which can generate a burst mode control signal from its interior.

Another object of the present invention is to provide a semiconductor memory device which can provide a burst mode control signal by using a counter.

A further object of the present invention is to provide a semiconductor memory device which can freely adjust the pulse length of a burst mode control signal.

In accordance with one embodiment of the present invention, a semiconductor memory device for providing a burst mode control signal includes a first logic circuit for generating a driving signal in response to a first logic level of a write and read control signal and a chip enable signal received from the exterior, a plurality of transition registers for respectively changing the driving signal in synchronization with a first edge of a clock signal to generate changed driving signals, and a second logic circuit for generating the burst mode control signal generated by the logic combination of the changed driving signals in response to a read latency control signal.

The preferred embodiment of the present invention will be described in detail with reference to the attached drawings. In the drawings, like reference numerals or symbols designate like elements.

DETAILED DESCRIPTION OF THE PREFERRED EMBODIMENT

Figure 1:
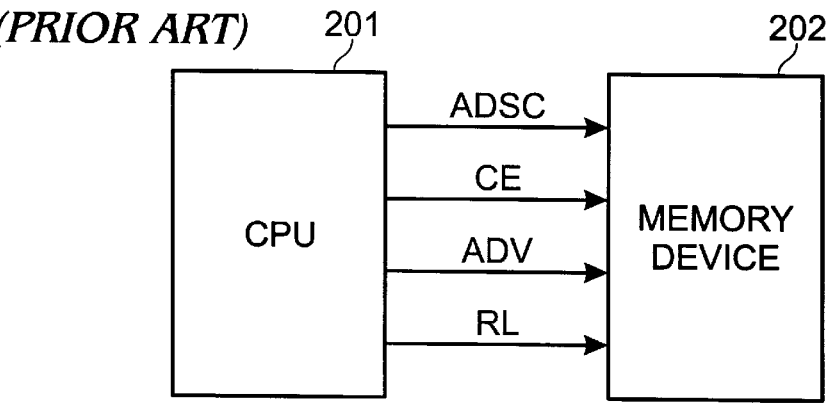
FIG. 1 is a block diagram showing the signal relationship between a CPU generating a burst mode control signal and a memory device according to the prior art.

When the number of successive addresses accessed after the initial address is held constant in a burst mode operation memory device, then the externally supplied ADV signal can be eliminated. That is, the ADV signal generated by the CPU 201 and input to memory device 202 in FIG. 1 can be internally generated within the memory device 302 of FIG. 2 which then internally generates the successive addresses for a predetermined number of cycles after an external address is input from CPU 301. Thus, the internally generated ADV signal controls the number of successive addresses accessed in a read/write operation.

Figure 2:
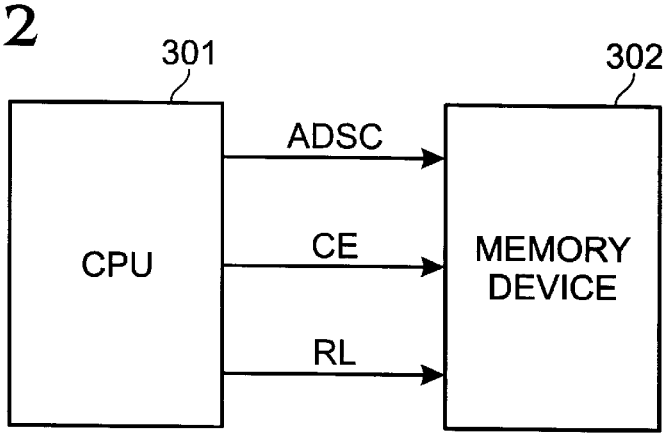
FIG. 2 is a block diagram showing the signal relationship between a CPU and a memory device according to the present invention.

As indicated in FIG. 2, with the elimination of the ADV signal, the control signals required to initiate a read/write operation are the ADSC, CE and RL signals which are supplied by CPU 301.

Figure 3A:
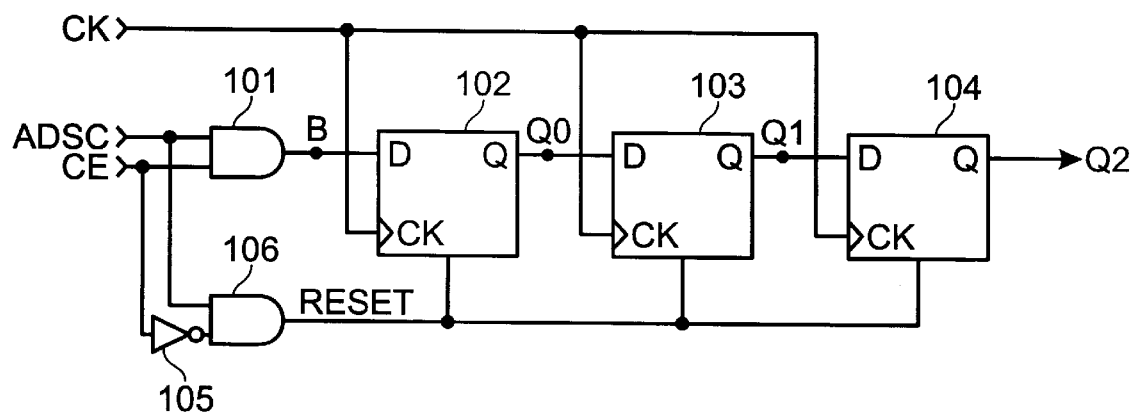
FIGS. 3A and 3B are logic diagrams showing a circuit according to the present invention internal to the memory device of FIG. 2 which generates a burst mode control signal.
Figure 3B:
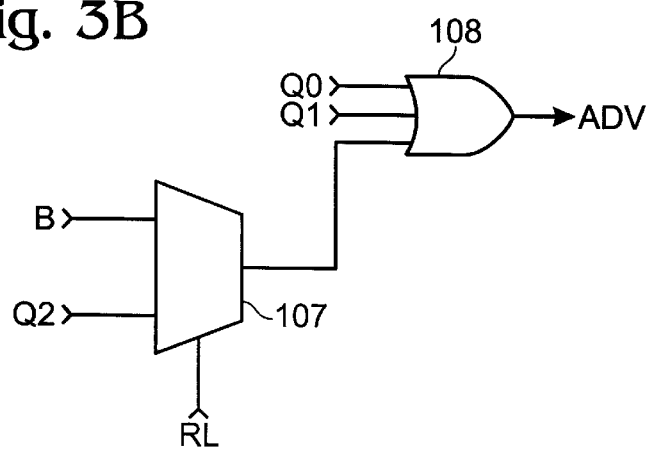
Figure 4:
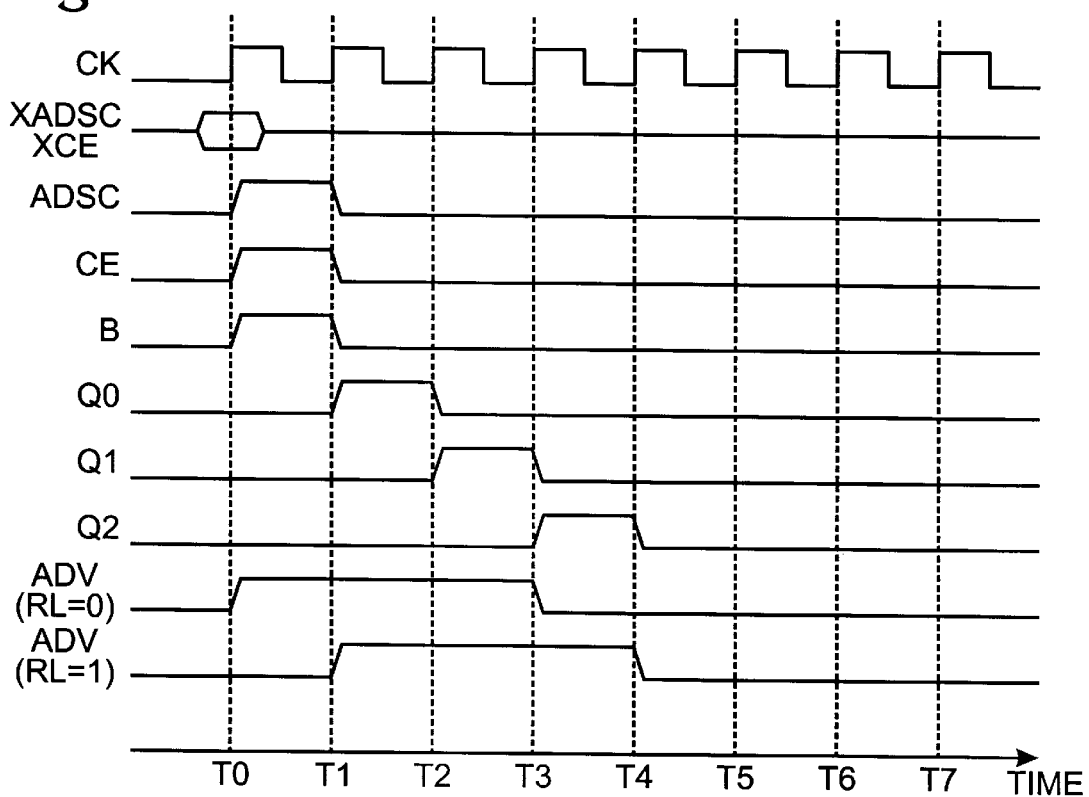
FIG. 4 is a timing chart illustrating the function of the circuits of FIGS. 3A and 3B.

FIGS. 3A and 3B are logic diagrams showing an embodiment of a burst mode control signal generating circuit, according to the present invention, which internally generates the burst mode control signal ADV. FIG. 4 is a timing chart illustrating the function of the burst mode control signal generating circuit shown in FIGS. 3A and 3B.

When the ADSC signal transitions to an active "HIGH" logic level and the chip enable signal CE is also at an active "HIGH" logic level, then the output of AND gate 101 will become active and initiate a read/write operation. The read latency signal RL determines when the burst mode control signal ADV will transition to an active "HIGH" level relative to the cycle when the read/write operation is initiated. When the RL signal is a logic "LOW" level, then the burst mode control signal ADV will transition to an active "HIGH" level in the same cycle as when the read/write operation is initiated (T0 in FIG. 4). When the RL signal is a logic "HIGH" level, then the ADV signal will delay one cycle and transition to an active "HIGH" level at T1.

The burst mode control signal ADV will remain at the inactive "LOW" logic level unless a read/write operation is initiated. When the ADSC signal is active and the CE signal is inactive, an active "HIGH" reset signal RESET is generated that forces the ADV signal to an inactive "LOW" state. That is, the burst mode control signal ADV is reset to its initial state by the combination of the output signal generated from an invertor 105, which inverts the chip enable signal CE, which is input to an AND gate 106 along with the ADSC signal.

Before a read/write operation is initiated, nodes B, Q0, Q1 and Q2 are initialized to the logic "LOW" level. Note that only three transition registers 102, 103 and 104 are illustrated in FIG. 3A. However, the number of transition registers can be increased as necessary to accommodate the number of addresses accessed in each read/write operation up to the capacity N of the entire memory device.

When a read/write operation is initiated, node B transitions to a "HIGH" level at TO indicated in FIG. 4. Node B is connected to the data input terminal of transition register 102, while the output terminal of the transition register 102 is connected to the data input terminal of transition register 103, and the output of transition register 103 is connected to the input terminal of transition register 104, thereby forming a transition register chain. The transition registers 102, 103 and 104 are synchronized by a clock signal CK and are reset by the RESET signal which initiates nodes Q0, Q1 and Q2 to an inactive logic "LOW" level. Node B is initially a logic "HIGH" level when the read/write operation is initiated. The logic "HIGH" level of node B is subsequently shifted through the registers 102, 103 and 104 by the clock CK. In the embodiment of the present invention illustrated herein, the burst mode control signal ADV is generated for a duration of three clock cycles of the clock signal CK in order to control a counter which generates successive addresses for three cycles after the read/write operation is initiated.

Referring now to FIG. 3B, read latency signal RL controls a two-to-one multiplexor 107 which receives at its input terminals the node B and the output Q2 of transition register 104. The output of multiplexor 107 is input to OR gate 108 along with the Q0 and Q1 signals. The output of OR gate 108 is the ADV signal.

When the read latency signal RL is at the logic "HIGH" level, multiplexer 107 passes the Q2 signal and the Q0, Q1 and Q2 signals are combined through OR gate 108 to generate the burst mode control signal ADV after a delay of one cycle of the CK signal. When the read latency signal RL is at the logic "LOW" level, the node B, Q0 and Q1 signals are combined through the OR gate 108 to generate the burst control signal ADV which becomes active at TO.

When more than four successive addresses are desired, then additional transition registers can be sequentially connected to the output terminal of the transition register 104. If the number of the transition registers is increased to N, then the node Q2 shown in FIG. 3B can be changed to be the node $Q_{N-1}$ and the OR gate 108 altered to accommodate input signals of $Q_O$–$Q_{N-2}$ plus the output of multiplexor 107. Multiplexor 107 then receives the node B signal and the $Q_{N-1}$ signal.

As described above, a burst control mode signal can be internally provided within a burst mode memory device. Furthermore, the pulse length of the burst mode control signal can be easily adjusted. That is, a burst mode control signal ADV having a predetermined pulse length can be generated by varying the number of transition registers within the burst mode control signal generating circuit of the present invention. The internally generated ADV signal can also be output from the burst memory device chip should the need arise.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A semiconductor memory device for providing a burst mode control signal, the semiconductor device comprising:
   a first logic circuit for generating a driving signal in response to a first logic level of an externally input write and read control signal and an externally input chip enable signal;
   a plurality of transition registers for respectively changing said driving signal in synchronization with a first edge of a clock signal to generate changed driving signals; and
   a second logic circuit for generating said burst mode control signal generated by a logical combination of said changed driving signals in response to an externally input read latency control signal, where the second logic circuit activates the burst mode control signal in a first cycle of the clock signal responsive to a first logic level of the read latency control signal and activates the burst mode control signal in a second cycle of the clock signal responsive to a second logic level of the read latency control signal; and
   a third logic circuit for providing a reset signal which initializes said plurality of transition registers when said write and read control signal is changed to the first logic level and said chip enable signal is changed to a second logic level.

2. A semiconductor memory device as claimed in claim 1, wherein said third logic circuit includes:
   an inverter for inverting said chip enable signal; and
   an AND gate for receiving said write and read control signal and an output signal of said invertor and, responsive thereto, generating said reset signal.

3. A semiconductor memory device as claimed in claim 1, wherein said first logic level is a logic HIGH level and said second logic level is a logic LOW level.

4. A semiconductor memory device for providing a burst mode control signal, the semiconductor device comprising:
   a first logic circuit for generating a driving signal in response to a first logic level of an externally input write and read control signal and an externally input chip enable signal;
   a plurality of transition registers for respectively changing said driving signal in synchronization with a first edge of a clock signal to generate changed driving signals; and
   a second logic circuit for generating said burst mode control signal generated by a logical combination of said changed driving signals in response to an externally input read latency control signal, wherein said second logic circuit includes:
   a multiplexer for selecting one of said driving signal and an output signal of a last one of said plurality of transition registers in response to said read latency control signal; and
   a fourth logic circuit for generating said burst mode control signal by a logical combination of an output signal of said multiplexer and output signals of said plurality of transition registers except said output signal of said last one of said plurality of transition registers.

5. A semiconductor memory device as claimed in claim 4, wherein said fourth logic circuit is an OR gate.

6. A semiconductor memory device for providing a burst mode control signal, the semiconductor memory device comprising:

a first logic gate for generating a driving signal in response to a first logic level of a write and read control signal and an externally input chip enable signal;

a plurality of transition registers for respectively changing said driving signal in synchronization with a rising edge of a clock signal;

a multiplexer for selecting one of said driving signal and an output signal of a last one of said plurality of transition registers in response to an externally input read latency control signal;

a second logic gate for generating said burst mode control signal by a logical combination of an output signal of said multiplexer and output signals of said plurality of transition registers except said output signal of said last one of said plurality of transition registers; and a logic circuit for providing a reset signal which initializes said plurality of transition registers when said write and read control signal is changed to the first logic level and said chip enable signal is changed to a second logic level.

7. A semiconductor memory device as claimed in claim 6, wherein said first logic gate is an AND gate.

8. A semiconductor memory device as claimed in claim 6, wherein said second logic gate is an OR gate.

9. A semiconductor memory device as claimed in claim 6, wherein said logic circuit includes:

an inverter for inverting said chip enable signal; and an AND gate for receiving said write and read control signal and an output signal of said invertor and generating said reset signal.

10. A semiconductor memory device as claimed in claim 6, wherein said first logic level is a logic HIGH level and said second level is a logic LOW level.

11. A semiconductor memory device for providing a burst mode control signal, comprising:

a driving signal generator for combining externally input memory control signals, thereby generating a driving signal;

a shift register for shifting the drive signal in response to a clock signal in order to generate a sequence of shifted drive signals corresponding to the drive signal; and a gate for selecting one of said driving signal and a last one of said sequence of shifted drive signals according to a read latency control signal and for combining one of said driving signal and the last one of said sequence of shifted drive signals, responsive to said read latency control signal, with remaining ones of said sequence of shifted drive signals thereby generating a desired burst mode control signal.

12. A semiconductor memory device as claimed in claim 11, wherein a time interval of said burst mode control signal relative to the externally input memory control signals is controlled according to a logic level of said read latency control signal.

13. A method for internally generating a burst mode control signal in a memory device, the method comprising:

providing a plurality of transition registers coupled in series;

logical ANDing an externally input read/write control signal and an externally input chip enable signal to generate a first logic signal;

inputting the first logic signal to a first one of the plurality of transition registers;

selecting one of the first logic signal and an output signal of a last one of the plurality of transition registers responsive to an externally input read latency signal in order to generate a second logic signal;

logical ORing the second logic signal and an output signal of each of the plurality of transition registers except the last one of the plurality of transition registers in order to generate the burst mode control signal.

14. The method of claim 13, further including:

resetting the plurality of transition registers responsive to an active state of the read/write control signal and an inactive state of the chip enable signal.

15. The method of claim 13, further including:

controlling the duration of the burst mode control signal by varying a number of transition registers of the plurality of transition registers.

\* \* \* \* \*